(12) United States Patent
Yamazaki et al.

(10) Patent No.: US 9,536,855 B2
(45) Date of Patent: Jan. 3, 2017

(54) SEMICONDUCTOR DEVICE AND METHOD OF FABRICATING SAME

(71) Applicant: MITSUBISHI ELECTRIC CORPORATION, Chiyoda-ku (JP)

(72) Inventors: Koji Yamazaki, Chiyoda-ku (JP); Takeshi Araki, Chiyoda-ku (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 0 days.

(21) Appl. No.: 14/784,127

(22) PCT Filed: Mar. 27, 2014

(86) PCT No.: PCT/JP2014/058852
§ 371 (c)(1),
(2) Date: Oct. 13, 2015

(87) PCT Pub. No.: WO2015/004956
PCT Pub. Date: Jan. 15, 2015

(65) Prior Publication Data
US 2016/0035691 A1 Feb. 4, 2016

(30) Foreign Application Priority Data

Jul. 10, 2013 (JP) ................................. 2013-144181

(51) Int. Cl.
*H01L 23/00* (2006.01)
*B23K 20/00* (2006.01)
(Continued)

(52) U.S. Cl.
CPC ............. *H01L 24/49* (2013.01); *B23K 20/004* (2013.01); *B23K 35/3006* (2013.01); *C22C 5/06* (2013.01); *H01L 24/32* (2013.01); *H01L 24/43* (2013.01); *H01L 24/83* (2013.01); *H01L 24/85* (2013.01); *H01L 23/49* (2013.01); *H01L 23/49513* (2013.01); *H01L 24/29* (2013.01); *H01L 24/45* (2013.01); *H01L 2224/04026* (2013.01); *H01L 2224/05568* (2013.01);
(Continued)

(58) Field of Classification Search
CPC .......................... H01L 23/49; H01L 23/49513
See application file for complete search history.

(56) References Cited

U.S. PATENT DOCUMENTS

2013/0043594 A1 2/2013 Sasaki et al.

FOREIGN PATENT DOCUMENTS

| JP | 11-186331 A | 7/1999 |
|---|---|---|
| JP | 2003-100811 A | 4/2003 |

(Continued)

OTHER PUBLICATIONS

International Search Report issued Jun. 24, 2014 in PCT/JP2014/058852 filed Mar. 27, 2014.

*Primary Examiner* — William Harriston
(74) *Attorney, Agent, or Firm* — Oblon, McClelland, Maier & Neustadt, L.L.P.

(57) ABSTRACT

A semiconductor device includes, an alloy layer sandwiched between a first Ag layer formed on a mounting board or circuit board and a second Ag layer formed on a semiconductor element, wherein the alloy layer contains an intermetallic compound of $Ag_3Sn$ formed by Ag components of the first Ag layer and the second Ag layer and Sn, and wherein a plurality of wires containing Ag are arranged extended from an outside-facing periphery of the alloy layer.

18 Claims, 10 Drawing Sheets

(51) Int. Cl.
*B23K 35/30* (2006.01)
*C22C 5/06* (2006.01)
*H01L 23/495* (2006.01)
*H01L 23/49* (2006.01)

(52) U.S. Cl.
CPC ............ *H01L 2224/05639* (2013.01); *H01L 2224/26175* (2013.01); *H01L 2224/29111* (2013.01); *H01L 2224/325* (2013.01); *H01L 2224/32225* (2013.01); *H01L 2224/32507* (2013.01); *H01L 2224/4501* (2013.01); *H01L 2224/45139* (2013.01); *H01L 2224/45144* (2013.01); *H01L 2224/45147* (2013.01); *H01L 2224/48225* (2013.01); *H01L 2224/48499* (2013.01); *H01L 2224/48507* (2013.01); *H01L 2224/49173* (2013.01); *H01L 2224/8309* (2013.01); *H01L 2224/83011* (2013.01); *H01L 2224/83014* (2013.01); *H01L 2224/8314* (2013.01); *H01L 2224/83191* (2013.01); *H01L 2224/83203* (2013.01); *H01L 2224/83385* (2013.01); *H01L 2224/83439* (2013.01); *H01L 2224/85801* (2013.01); *H01L 2924/0103* (2013.01); *H01L 2924/014* (2013.01); *H01L 2924/0105* (2013.01); *H01L 2924/01013* (2013.01); *H01L 2924/01014* (2013.01); *H01L 2924/01015* (2013.01); *H01L 2924/01022* (2013.01); *H01L 2924/01026* (2013.01); *H01L 2924/01027* (2013.01); *H01L 2924/01028* (2013.01); *H01L 2924/01029* (2013.01); *H01L 2924/01031* (2013.01); *H01L 2924/01032* (2013.01); *H01L 2924/01046* (2013.01); *H01L 2924/01047* (2013.01); *H01L 2924/01049* (2013.01); *H01L 2924/01051* (2013.01); *H01L 2924/01078* (2013.01); *H01L 2924/01079* (2013.01); *H01L 2924/01083* (2013.01); *H01L 2924/01322* (2013.01); *H01L 2924/1033* (2013.01); *H01L 2924/10254* (2013.01); *H01L 2924/10272* (2013.01); *H01L 2924/12* (2013.01); *H01L 2924/1305* (2013.01); *H01L 2924/13055* (2013.01); *H01L 2924/13091* (2013.01); *H01L 2924/19107* (2013.01); *H01L 2924/2064* (2013.01); *H01L 2924/20641* (2013.01); *H01L 2924/20751* (2013.01); *H01L 2924/20752* (2013.01); *H01L 2924/20753* (2013.01); *H01L 2924/20754* (2013.01); *H01L 2924/20755* (2013.01); *H01L 2924/351* (2013.01)

(56) References Cited

FOREIGN PATENT DOCUMENTS

| JP | 2004-174522 A | 6/2004 |
|----|---------------|--------|
| JP | 2005-32834 A  | 2/2005 |
| JP | 2005-236019 A | 9/2005 |
| JP | 2009-164261 A | 7/2009 |
| JP | 2012-4594 A   | 1/2012 |
| JP | 2013-38330 A  | 2/2013 |

|  |  | Ag | Sn | Total |
|---|---|---|---|---|
| Atomic % (at%) | Ratio | 3 | 1 | 4 |
|  | Percent[%] | 75% | 25% | 100% |
| Mass % (wt%) | Ratio | 81 | 30 | 111 |
|  | Percent[%] | 73% | 27% | 100% |
| Volume % (vol%) | Ratio | 0.070 | 0.036 | 0.106 |
|  | Percent[%] | 66% | 34% | 100% |
| Density | g/cm$^3$ | 10.5 | 7.4 | − |
| Atomic Weight | g/mol | 108 | 119 | − |

FIG. 10

| | Wire Extension Direction | Wire Size x [μm] | Pitch y [μm] | Required Plating Thickness [μm] | Actual Plating Thickness z [μm] | Compatibility to Theoretical Formula | Required Sn-foil Thickness [μm] | Actual Sn-foil Thickness t [μm] | Alloy Formation | Void Rate [%] |
|---|---|---|---|---|---|---|---|---|---|---|
| Example 1 | 1 direction | 12.0 | 30.0 | 6.3 | 6.5 | OK | 8.2 | 9.0 | OK | 4 |
| Example 2 | 1 direction | 15.0 | 37.5 | 7.9 | 8.0 | OK | 10.3 | 11.0 | OK | 4 |
| Example 3 | 1 direction | 18.0 | 45.0 | 9.5 | 10.0 | OK | 12.3 | 13.0 | OK | 4 |
| Example 4 | 1 direction | 20.0 | 50.0 | 10.5 | 11.0 | OK | 13.7 | 14.0 | OK | 3 |
| Example 5 | 1 direction | 23.0 | 57.5 | 12.1 | 12.5 | OK | 15.8 | 15.5 | OK | 2 |
| Example 6 | 1 direction | 25.0 | 62.5 | 13.1 | 14.0 | OK | 17.1 | 17.5 | OK | 3 |
| Example 7 | 1 direction | 30.0 | 75.0 | 15.8 | 16.5 | OK | 20.6 | 21.0 | OK | 3 |
| Example 8 | 1 direction | 35.0 | 87.5 | 18.4 | 19.0 | OK | 24.0 | 25.0 | OK | 2 |
| Example 9 | 1 direction | 40.0 | 100.0 | 21.0 | 21.0 | OK | 27.4 | 28.0 | OK | 2 |
| Example 10 | 1 direction | 50.0 | 125.0 | 26.3 | 27.0 | OK | 34.3 | 35.0 | OK | 0 |
| Comparative Example 1 | 1 direction | 12.0 | 30.0 | 6.3 | 6.0 | NG | 8.2 | 9.0 | NG | 2 |
| Comparative Example 2 | 1 direction | 20.0 | 50.0 | 10.5 | 9.0 | NG | 13.7 | 14.0 | NG | 4 |
| Comparative Example 3 | 1 direction | 30.0 | 75.0 | 15.8 | 14.0 | NG | 20.6 | 21.0 | NG | 2 |
| Comparative Example 4 | 1 direction | 50.0 | 125.0 | 26.3 | 25.0 | NG | 34.3 | 35.0 | NG | 2 |

FIG. 11

| | Wire Extension Direction | Wire Size x [μm] | Pitch y [μm] | Required Plating Thickness [μm] | Actual Plating Thickness z [μm] | Compatibility to Theoretical Formula | Required Sn-foil Thickness [μm] | Actual Sn-foil Thickness t [μm] | Alloy Formation | Void Rate [%] |
|---|---|---|---|---|---|---|---|---|---|---|
| Example 11 | 1 direction | 12.0 | 40.0 | 8.4 | 9.0 | OK | 9.2 | 10.0 | OK | 3 |
| Example 12 | 1 direction | 20.0 | 60.0 | 12.6 | 13.0 | OK | 14.8 | 16.0 | OK | 4 |
| Example 13 | 1 direction | 30.0 | 80.0 | 16.8 | 17.0 | OK | 21.2 | 22.0 | OK | 2 |
| Example 14 | 1 direction | 50.0 | 140.0 | 29.4 | 31.0 | OK | 36.0 | 37.0 | OK | 1 |
| Comparative Example 5 | 2 directions | 30.0 | 75.0 | – | 16.5 | – | – | 50.0 | NG | 15 |
| Comparative Example 6 | 2 directions | 30.0 | 75.0 | – | 16.5 | – | – | 40.0 | OK | 20 |

|  | 1 minute | 3 minutes | 5 minutes | 10 minutes |
|---|---|---|---|---|
| 250°C | 3.8 | 7.0 | 8.5 | 12.7 |
| 300°C | 10.8 | 16.8 | 21.3 | 32.5 |
| 350°C | 14.0 | 24.2 | 31.3 | 42.0 |
| 400°C | 31.5 | 53.0 | 71.6 | 102.1 |

SEMICONDUCTOR DEVICE AND METHOD OF FABRICATING SAME

TECHNICAL FIELD

The present invention relates to a semiconductor device and a semiconductor device fabrication method, and, in particular, relates to a metal bonding between a mounting board for mounting a semiconductor element and the semiconductor element, etc., and a metal bonding between a semiconductor element and a lead terminal, etc.

BACKGROUND ART

In recent years, there is an increasingly growing demand of reliability for semiconductor devices, and in particular, there is a strong demand to improve reliability for a bonding portion between a semiconductor element and a circuit board having a large difference in thermal expansion coefficient therebetween. Heretofore, semiconductor elements whose base materials are silicon (Si) and gallium arsenide (GaAs) have been often used, and their operation temperatures are from 100° C. to 125° C. As soldering materials for bonding the semiconductor elements to electrodes of electronic circuits, there are used 95Pb-5Sn (mass %) for Si devices, 80Au-20Sn (mass %) for gallium arsenide devices, and the like, from viewpoints of: crack resistance against repetitive thermal stress due to difference in thermal expansion between a semiconductor element and a circuit board; high melting point to meet a multistage solder-bonding at the time of assembly; and further, contamination tolerance of the devices. However, from the aspect of reducing environmental load, 95Pb-5Sn containing a large amount of harmful lead (Pb) is problematic, and further, from a viewpoint of price-rise and reserve of novel metals, a substituent material for 80Au-20Sn is strongly demanded.

On the other hand, from the aspect of saving energy, devices whose base materials are silicon carbide (SiC) and gallium nitride (GaN) have been under active development as next-generation devices. From the aspect of reducing power loss, they are required to have operation temperatures of 175° C. or more and it is said that the temperature will become 300° C. in future.

For dealing with the above requirement, a high-temperature soldering material (high-temperature solder alloy) is required that has a superior thermal resistance as well as a high melting point. Such a solder alloy has been hitherto a Pb-based solder alloy having a melting temperature of around 300° C. Its examples include Pb-10Sn (mass %), Pb-5Sn (mass %), Pb-2Ag-8Sn (mass %), Pb-5Ag (mass %) and the like, and hence, Pb is mainly given as a major component. The solidus temperature of Pb-10Sn is 268° C. and its liquidus temperature is 302° C. The solidus temperature of Pb-5Sn is 307° C. and its liquidus temperature is 313° C. The solidus temperature of Pb-2Ag-8Sn is 275° C. and its liquidus temperature is 346° C. The solidus temperature of Pb-5Ag is 304° C. and its liquidus temperature is 365° C.

Meanwhile, from the aspect of environmental protection, it has recently been required generally in soldering technology, to use a Pb-free solder alloy instead of the Pb series solder alloy. As a matter of course, with respect to the aforementioned Pb—Sn series high-temperature solder having been used for conventional semiconductor devices, it has also been required to instead use a Pb-free solder alloy.

However, while a variety of Pb-free solder alloys have been proposed hitherto, they consist mainly of Sn, so that there is no high-temperature solder alloy whose solidus temperature is 260° C. or more. For example, in an Sn—Ag series solder alloy whose solidus temperature (eutectic temperature) is 221° C., as Ag is increased, the liquidus temperature rises but the solidus temperature does not rise. In an Sn—Sb series solder alloy whose solidus temperature is 227° C., if Sb is extremely increased in order to make the solidus temperature higher, the liquidus temperature also becomes higher extremely. Further, it is unable to change such properties even if another element is added to them. Thus, it is conventionally thought that there is no Pb-free solder alloy that does not melt even at 300° C. and is thus usable as a solder.

For that reason, a bonding technology without using a high-temperature solder alloy has been under consideration. What has been considered as the bonding technology without using a high-temperature solder alloy is bonding methods by use of an intermetallic compound having a melting temperature higher than that of the Pb-free solder consisting mainly of Sn. Of these, in particular, a bonding method by means of an intermetallic compound of Ag and Sn (Ag3Sn) is promising in which Ag is used that diffuses quickly into Sn to thereby form the intermetallic compound at a relatively low temperature.

For example, in Patent Document 1, there is described a composite solder that is Pb-free and can be used for high-temperature-side solder bonding in a temperature-hierarchical bonding. In Patent Document 1, the composite solder has a configuration in which a metal net made of Cu is sandwiched and pressure-bonded between two solder foils, and such a fact is shown that when the metal net and the solder foils are thus-stacked and press-formed together, Sn of the solder foils is penetrated into apertures of the metal net, so that an intermetallic compound of Cu and Sn (Cu3Sn, Cu6Sn5) is formed after heating to thereby achieve enhancement in thermal resistance. Further, in Patent Document 1, there is shown that a net of Ag other than Cu is likewise an important candidate, and an Ag3Sn compound that is a high-melting-point intermetallic compound allows a joint connection that doesn't melt even at 280° C. There is also shown that, as another alloy series that is hard and has a low melting point like the above, a Cu—Sn series (for example, Cu6Sn5) can accommodate in a similar manner.

As another instance, in Patent Document 2, there is described a bonding sheet for bonding a chip (semiconductor element) and a die together. The bonding sheet in Patent Document 2 comprises an Ag sheet with shaped grooves or a mesh-like sheet by warp and weft knitting of Ag wires. An Sn plating of a thickness of 0.3-2.0 μm is applied on the surface of the Ag sheet, so that when subjected to pressing and heating, Ag is supplied thereto successively from the Ag sheet as a core due to melting or diffusion at the time of heating. Thus, the bonding sheet in Patent Document 2 is shown as being capable of raising the melting point of a finally formed Ag—Sn layer to 470° C. or more, to thereby provide a highly thermal-resistant bonding portion. Further shown is that the Ag sheet having in-groove spaces is so soft as to absorb thermal distortion, to thereby enhance reliability.

CITATION LIST

Patent Document

Patent Document 1: Japanese Patent Application Laid-open No. 2004-174522 (Paragraphs 0024 to 0053, 0069; FIG. 1, FIG. 8)

Patent Document 2: Japanese Patent Application Laid-open No. 2012-004594 (Paragraphs 0058 to 0060; FIG. 13, FIG. 14)

SUMMARY OF THE INVENTION

Problems to be Solved by the Invention

However, in the case where the Ag net is used in the composite solder of Patent Document 1, at the time of melting of Sn, only at places where the Ag net exists, Ag interdiffuses with Sn to form $Ag_3Sn$ having a high melting point, so that Sn is spatially surrounded in four directions by this $Ag_3Sn$, and further, at the time of melting of Sn, its part melts while entraining air. This results in voids existing inside to no small extent. In addition, contraction in volume occurs when $Ag_3Sn$ is formed, so that it is difficult to completely eliminate the voids. When the voids in the melted Sn are surrounded in four directions by $Ag_3Sn$ having a high melting point, they becomes immovable as if they are enclosed by walls, so that even when a circuit board and a semiconductor element, etc. are bonded together in vacuum, the voids do not go away completely, thus forming a bonding portion having many voids. The same applies also to Patent Document 2, that is, when voids are surrounded in four directions by $Ag_3Sn$ having a high melting point, routes through which the voids go away are not established, so that many voids will be likely to emerge.

Other than the above, such a method is conceivable in which, in order to form a high-melting-point intermetallic compound in a bonding portion between a circuit board and a semiconductor element, etc., fine Ag particles are dispersed instead of using the Ag net; however, even if the Ag particles were once distributed uniformly, Sn flows at the time of melting to no small extent, so that the Ag particles are likely to be displaced to make the bonding portion non-uniform. This makes it difficult to ensure thermal resistivity of the bonding portion because $Ag_3Sn$ is formed partly in the bonding portion whereas a portion consisting only of Sn emerges partly in the bonding portion.

The present invention has been made to solve the problems as described above, and an object thereof is to form a high-melting-point intermetallic compound in a void-reduced state, in a bonding portion where bonding is made between bonding objects.

Means for Solving the Problems

A semiconductor device of the present invention is characterized by comprising an alloy layer sandwiched between a first Ag layer formed on a mounting board and a second Ag layer formed on a semiconductor element, wherein the alloy layer contains an intermetallic compound of $Ag_3Sn$ formed by Ag components of the first Ag layer and the second Ag layer and Sn, and a plurality of wires containing Ag are arranged as being extended from an outside-facing periphery of the alloy layer.

Effect of the Invention

According to the semiconductor device of the invention, it comprises a structure in which the plurality of wires containing Ag are connected to the alloy layer containing the intermetallic compound of $Ag_3Sn$, so that, with respect to voids that would have been produced to no small extent at the time of forming the alloy layer 13, routes through which the voids go away have been established between the wires 5. Thus, it is possible to form the high-melting-point intermetallic compound in a void-reduced state, in the bonding portion where bonding is made between the bonding objects.

BRIEF DESCRIPTION OF THE DRAWINGS

FIG. 10 is a table showing characteristics in examples of the invention and in comparison examples.

FIG. 11 is a table showing characteristics in other examples of the invention and in other comparison examples.

MODES FOR CARRYING OUT THE INVENTION

Embodiment 1

Figure 1A:
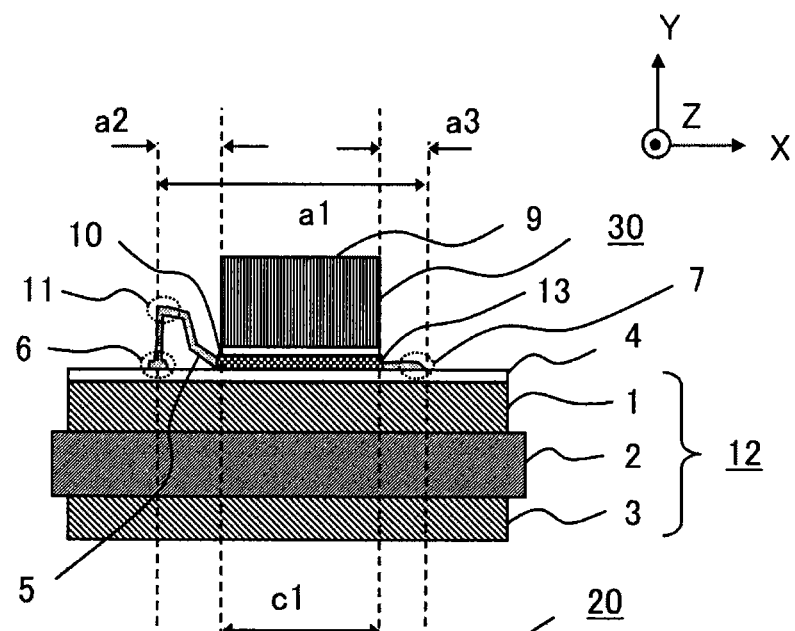
FIG. 1A and FIG. 1B are sectional and top views of a semiconductor device according to Embodiment 1 of the invention.
Figure 1B:
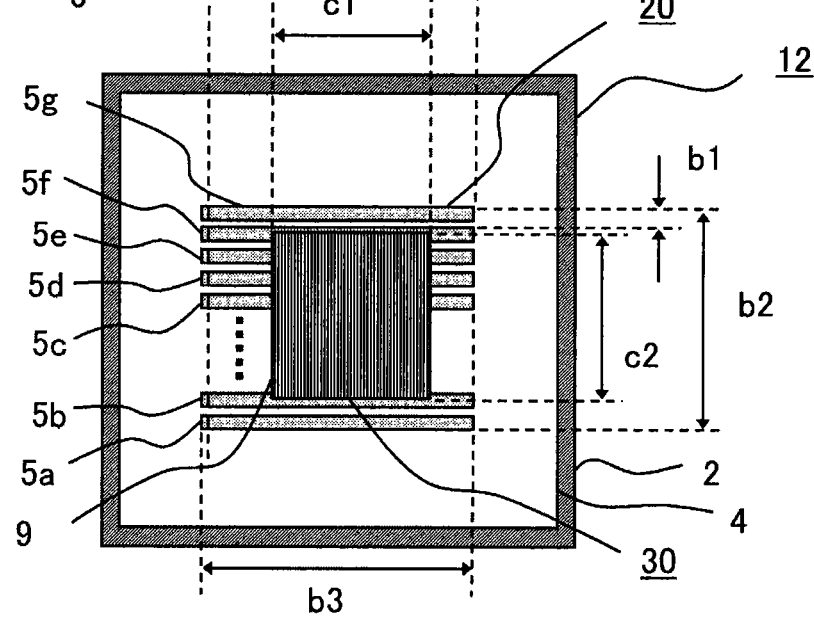

FIG. 1A and FIG. 1B are sectional and top views of a semiconductor device according to Embodiment 1 of the invention. FIG. 1A is the sectional view of the semiconductor device, and FIG. 1B is the top view of the semiconductor device. A semiconductor device 30 comprises an alloy layer 13 that is sandwiched between an Ag layer 10 formed on a semiconductor element 9 using as a base material, silicon (Si) or a wide bandgap semiconductor material such as silicon carbide (SiC) or the like, and an Ag layer 4 formed on a circuit board 12; wherein the alloy layer 13 contains an intermetallic compound of $Ag_3Sn$ formed by Ag components of the Ag layer 4 & Ag layer 10 and Sn, and a plurality of wires 5 containing Ag are arranged as being extended from the outside-facing periphery of the alloy layer 13. The circuit board 12 as a mounting board for mounting the semiconductor element 9 is a DBC (Direct Bonded Cupper) board, and comprises an insulating member 2, an upper electrode 1 formed on the upper side of the insulating member 2 and a lower electrode 3 formed on the lower side of the insulating member 2. The alloy layer 13 is made of an intermetallic compound, for example, Ag3Sn. In order to form the alloy layer 13, a wire structure 20 in which the plurality of wires 5 are arranged is formed on the Ag layer 4 of the circuit board 12. The plurality of wires 5 are arranged as being extended in the same direction from the outer-facing periphery of the alloy layer 13. The wire structure 20 is formed on an area that is wider than an X-direction width c1 and a Z-direction width c2 of the semiconductor element 9. The wire structure 20 has an X-direction width b3 and a Z-direction width b2. In FIG. 1B, among the plurality of wires 5, seven wires 5a, 5b, 5c, 5d, 5e, 5f and 5g are illustrated explicitly. A pitch at which the plural wires 5 are arranged is b1. Note that, with respect to the reference numeral for the wires, numeral 5 is used collectively, and numerals 5a to 5g are used when they are to be described distinctively.

Each of the wires 5 that constitute the wire structure 20 is formed with a bent portion 11 on the left side in FIG. 1A and FIG. 1B. With the wire 5, a ball bond 6 is formed at a position that is left-outwardly apart by just a length of a2 from the mounting position of the semiconductor element 9, and a stitch bond 7 is formed at a position that is right-outwardly apart by just a length of a3 from the mounting position of the semiconductor element 9. Note that, while the bent portion 11 can be at an arbitrary height, the bent portion 11 will finally be at a highest position when looping is done. A length a1 is a length resulted from adding the length a2 and the length a3 to the X-direction length c1 of the semiconductor element 9. The ball bond 6 is larger than the wire size of the wire 5, and a length from the left outside end of the ball bond 6 to the right outside end of the stitch bond 7 is b3.

Next, it will be theoretically demonstrated that, according to the bonding method of the invention, when the alloy layer 13 is formed in the bonding portion where the semiconductor element 9 and the circuit board 12 are bonded together, the intermetallic compound of Ag3Sn is formed and Sn does not remain in the alloy layer 13. In order to avoid Sn from remaining inside the bonding portion, optimum values are to be given in the formation condition; nevertheless, in Patent Documents 1 and 2, what is shown is only that Ag3Sn is formed, and thus, it is not theoretically demonstrated that Sn does not remain inside the bonding portion. Namely, the restricted ranges of values shown in Patent Documents 1 and 2 are insufficient as the basis for demonstrating that Sn does not remain.

Figures 2, 3:
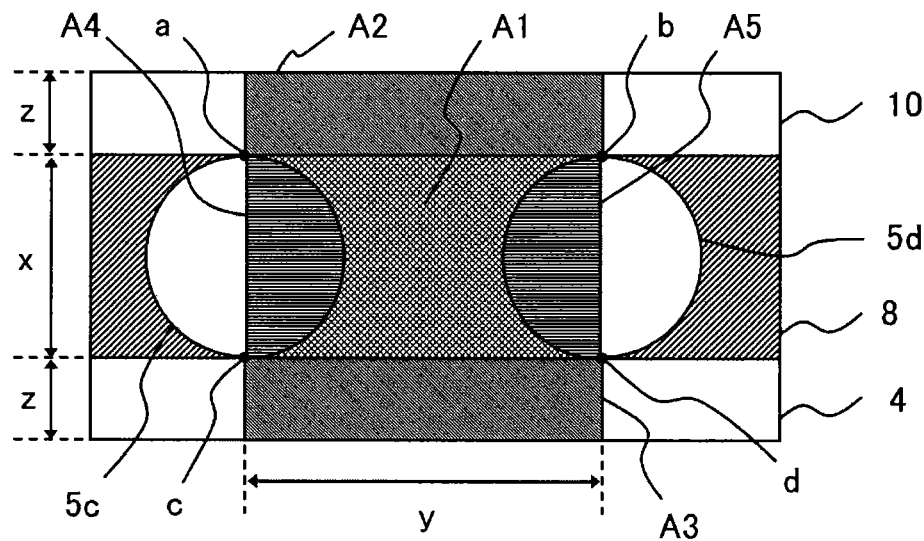
FIG. 2 is a diagram illustrating an alloy layer of the invention.
FIG. 3 is a table showing basic characteristics of an intermetallic compound of $Ag_3Sn$.
Figure 4A:
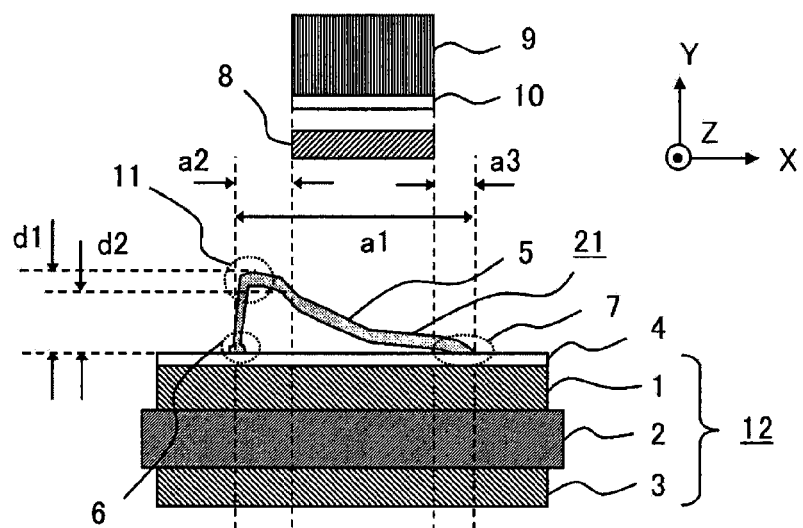
FIG. 4A and FIG. 4B are diagrams illustrating a semiconductor device fabrication method according to Embodiment 1 of the invention.
Figure 4B:
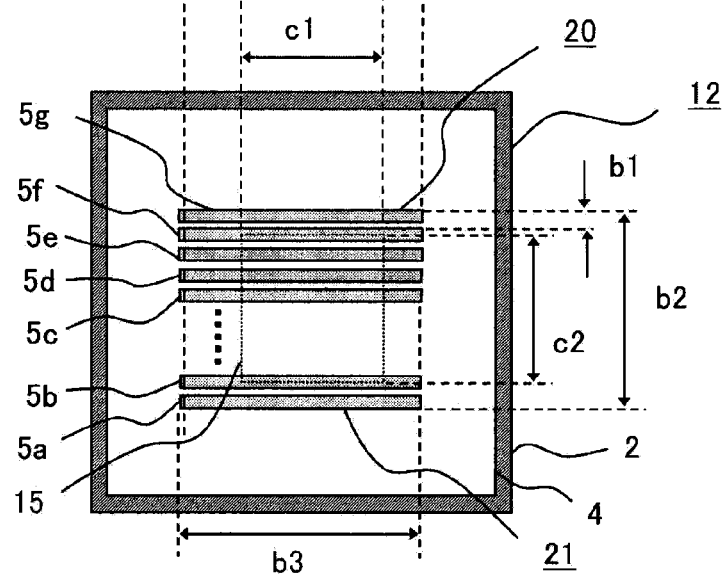

FIG. 2 is a diagram illustrating the alloy layer of the invention, and FIG. 3 is a table showing basic characteristics of the intermetallic compound of Ag3Sn. First, the basic characteristics of Ag, Sn and Ag3Sn will be described using FIG. 3. In FIG. 3, shown in an Ag column are values of Ag in Ag3Sn, in an Sn column are values of Sn in Ag3Sn, and in a total column are values of Ag3Sn. The composition ratio of Ag and Sn in Ag3Sn is 3:1 by atomic % (at %), so that Ag 75 at %: Sn 25 at % is given. For converting these into mass % (wt %), calculation is made on the basis that the atomic weight of Ag is 108 g/mol and the atomic weight of Sn is 119 g/mol, so that Ag 73 wt %: Sn 27 wt % is given. Furthermore, for converting this into volume % (vol %), calculation is made on the basis that the density of Ag is 10.5 g/cm3 and the density of Sn is 7.4 g/cm3, so that Ag 66 vol %: Sn 34 vol % is given. Namely, even if Sn endlessly present around Ag, its portion to become Ag3Sn is about half the volume of Ag (34/66=0.52 0.5), and Sn other than that portion does not diffuse and remains. From another viewpoint, when Ag becomes Ag3Sn, this results in an increase of volume only by about 0.5 times the volume of Ag (namely, volume becomes about 1.5 times).

Using a schematic model with respect to the bonding portion of the invention where the semiconductor element 9 and the circuit board 12 are bonded together, it will be demonstrated that Sn does not remain inside the bonding portion. The wires 5c and 5d made of Ag (referred to as Ag wires, if appropriate) are disposed inside an Sn layer 8, the Ag layer 10 is disposed on the upper side of the Sn layer 8, and the Ag layer 4 is disposed on the lower side of the Sn layer 8. This model schematically shows such a configuration in which: Ag plating has been applied to the bonding objects of the invention (semiconductor element 9, upper electrode 1); Ag wires are spread on a plane only in one direction and are bonded so as not to flow out at the time of melting of the solder; and Ag3Sn (melting point is about 470° C.) is formed by melting Sn from the upper side of the wires. The Ag layers 10, 4 each having a thickness of z are placed on the upper and lower sides of the Sn layer 8 in which the Ag wires 5c, 5d having a wire diameter of x are enclosed, and the Ag wires 5c, 5d are arranged side-by-side with an interval of a given pitch y. In FIG. 2, a point "a" is a contact point between a circle of the Ag wire 5c and the Ag layer 10, and a point "c" is a contact point between the circle of the Ag wire 5c and the Ag layer 4. In FIG. 2, a point "b" is a contact point between a circle of the Ag wire 5d and the Ag layer 10, and a point "d" is a contact point between the circle of the Ag wire 5d and the Ag layer 4.

The pitch for the Ag wires 5 is restricted to some extent by the wire bonding apparatus, so that, relative to the wire size x (wire diameter x), the pitch y is limited to around y=2.5x. Such an apparatus-related limit value of the pitch y is herein defined as a formula (1). Thus, a condition shown by a formula (2) is required for the pitch y. If the pitch is made narrower than that value, the wire bonding apparatus will make contact with the wire adjacent thereto. For example, the pitch 30 μm is given in the case of the Ag wire of Ø 12 μm, and the pitch 50 μm is given in the case of the Ag wire of Ø 20 μm.

$$y=2.5x \tag{1}$$

$$y \geq 2.5x \tag{2}$$

It is required that Ag3Sn be formed in a region A1 inside the Sn layer 8 surrounded by the points a, b, c and d as shown in FIG. 2 through diffusion of surrounding Ag to that region. In view of the result that, when Ag moves into the Sn layer 8 to become Ag3Sn, this provides an increase in volume only by 0.5 times the volume of Ag as aforementioned, a following relational formula is established with respect to a limited value imposed on Ag3Sn.

$$\text{Ag supplied amount} \times 0.5 \geq \text{region } A1 \text{ surrounded by } a,b,c,d \tag{3}$$

A calculation formula that applies this formula (3) specifically to the cross-section in FIG. 2, is represented as follow.

$$0.5 \times (2yz + \pi(x/2)2) \geq (xy - \pi(x/2)2) \tag{4}$$

Here, "2yz" in the left-hand side corresponds to a total area of a region A2 and a region A3, and "π(x/2)2" in the left-hand side corresponds to a total area of a semi-circular region A4 and a semi-circular region A5. The right-hand side corresponds to an area of the region A1.

Transforming the formula (4) provides a formula (6) through a formula (5).

$$yz + \tfrac{1}{8}\pi x^2 \geq xy - \tfrac{2}{8}\pi x^2 \quad (5)$$

$$yz + \tfrac{3}{8}\pi x^2 \geq xy \quad (6)$$

Here, when the formula (1) indicative of the aforementioned apparatus-related limit value of the pitch y is applied to the formula (6), there is provided a formula (11) through formulae (7) to (10).

$$2.5xz + \tfrac{3}{8}\pi x^2 \geq 2.5x^2 \quad (7)$$

$$2.5z + \tfrac{3}{8}\pi x \geq 2.5x \quad (8)$$

$$2.5z \geq (2.5 - \tfrac{3}{8}\pi)x \quad (9)$$

$$z \geq ((2.5 - \tfrac{3}{8}\pi)/2.5)x \quad (10)$$

$$z \geq 0.53x \quad (11)$$

When the formula (1) indicative of the aforementioned apparatus-related limit value of the pitch y is applied to the formula (11), there is provided a formula (12).

$$z \geq 0.21y \quad (12)$$

To summarize the above results, the following three formulae are established for the Ag wire diameter x, the pitch y and the thickness z of the Ag layer.

$$y = 2.5x \quad (1)$$

$$z \geq 0.53x \quad (11)$$

$$z \geq 0.21y \quad (12)$$

Furthermore, it is possible to calculate a required amount of Sn. In consideration of the supplying method that supplies Sn from the foil-like Sn layer 8, a required thickness t of the Sn layer 8 is calculated as follows.

$$t \approx (xy - \pi(x/2)^2)/y \quad (13)$$

Applying the formula (1) to the formula (13) to eliminate y or x, provides a formula (14) and a formula (15).

$$t \approx 0.68x \quad (14)$$

$$t \approx 0.27y \quad (15)$$

Actually, Sn will also escape to spread outside and is thus necessary to be supplied with a thickness that is somewhat thicker than that of the formula (14) and the formula (15).

Based on the above results, samples were fabricated in which the Ag wire size x, the pitch y and the thickness z of the Sn layer were varied. A specific method for fabricating the samples will be described using FIG. 1A, FIG. 1B and FIG. 4A, FIG. 4B.

First, as the circuit board 12, a commercially-available DBC board with a size of 30 mm×30 mm and a thickness of 1.12 mm, was provided. The thicknesses of the upper electrode 1 made of Cu, the insulating member 2 made of Si3N4 and the lower electrode 3 made of Cu, were 0.4 mm, 0.32 mm and 0.4 mm, respectively. As for the Ag layer 4 for the circuit board 12, Ag plating was applied up to 6.5 µm thereon. The DBC board is available, for example, from Denki Kagaku Kogyo Kabushiki Kaisha, Japan. The Ag plating can be executed, for example, at Taiyo manufacturing Co., Ltd, Japan. Then, as the Sn layer 8, a commercially-available Sn foil with a size of 100 mm×100 mm, a thickness of 9 µm and a purity of 99.5 wt %, was provided. The Sn foil is available, for example, from Fukuda Metal Foil & Powder Co., Ltd, Japan. Then, as the semiconductor element 9, an SiC element with a size of 7 mm×7 mm and a thickness of 0.25 mm, was provided. On the back side of the SiC element, 6.5 µm Ag was being metalized to form the Ag layer 10. Such an SiC element is available, for example, from Nippon Steel & Sumitomo Metal Corporation, Japan.

Then, the Ag wire 5 with Ø 12 µm, a wound length of 100 m and a purity of 99.99 wt % was provided. The Ag wire is available, for example, from Noge Electric Industries Co., Ltd, Japan. Using a commercially-available wire bonder, the Ag wire was bonded to the Ag layer 4 on the circuit board 12. The wire bonder may be, for example, FB-910 from Kaijo Corporation, Japan or UTC-5000 from Shinkawa Ltd, Japan.

Details of wire bonding (wire connecting step) will be described. Firstly, while blowing a nitrogen gas containing 5% hydrogen to an end of the wire 5, a ball of about 1.5 to 1.8 times larger than the wire size is formed thereat by discharging under the discharging condition (discharge current, time period, gas blowing amount) where a real spherical ball can be stably formed, and then, on the Ag layer 4 on the circuit board 12, the ball bond 6 is formed by the application of an ultrasonic wave and a pressure, at a position that is outwardly apart by a2=2 mm from the mounting position of the semiconductor element 9. At this time, if a real spherical ball is not stably formed to thereby cause eccentricity, bonding is not properly done because the pressure is not uniformly applied thereto at the time of bonding. Thus, care should be taken to deal therewith. Further, in the case of eccentricity, the pitch is not stably given because bonding can not be done at an intended position. Thus, care should be taken to deal therewith.

Figure 7:
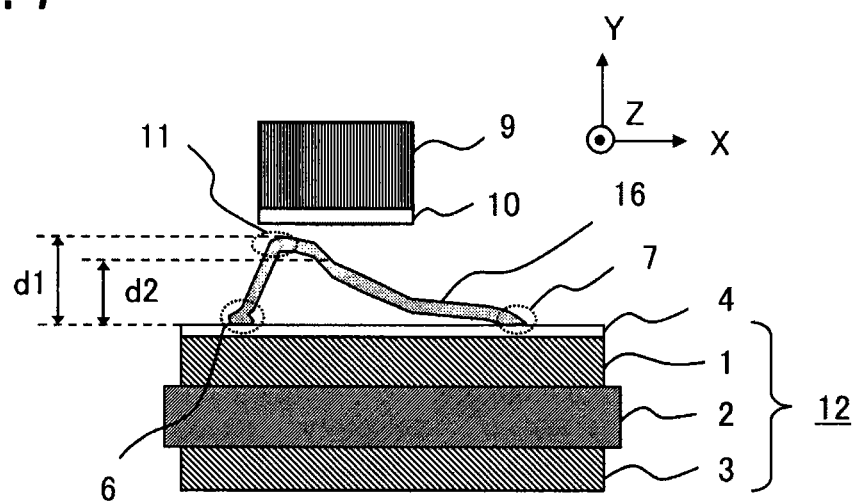
FIG. 7 is a diagram illustrating positions of a semiconductor element and a wire according to a comparison example.
Figure 8:
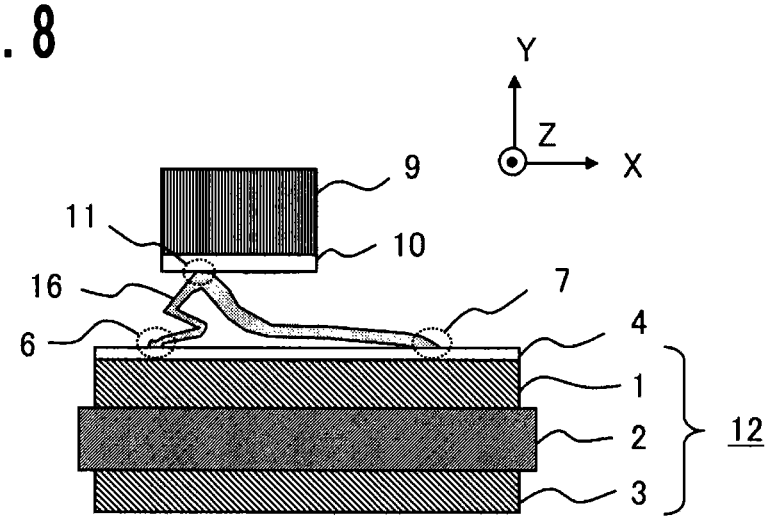
FIG. 8 is a diagram illustrating other positions of the semiconductor element and the wire according to the comparison example.

Then, after forming the bent portion 11, the wire 5 is spread up to the length a1=10 mm that is longer than the element size c1=7 mm of the semiconductor element 9, and then the stitch bond 7 is formed by the application of an ultrasonic wave and a pressure, at a position that is apart by a3=1 mm from the mounting position of the semiconductor element 9. Note that, while the bent portion 11 can be at an arbitrary height, the bent portion 11 will finally be at a highest position when looping is done, so that its loop height d1 is adjusted to be 50 µm that is a limit in the commercially-available apparatus. Further, any loop height d2 on the mounting position of the element is adjusted to be 80% or less of d1. This is because, if a maximum loop height is present within the mounting position, as shown in FIG. 7 and FIG. 8, a wire 16 is crashed while overlapping itself when a pressure is applied thereto at the time of the following bonding, and this is not preferable. FIG. 7 and FIG. 8 are diagrams each illustrating the positions of the semiconductor element and the wire according to a comparison example. FIG. 7 shows a state before the semiconductor element 9 makes contact with the wire 16, and FIG. 8 shows a state where the semiconductor element 9 presses against the wire 16.

Figure 5:
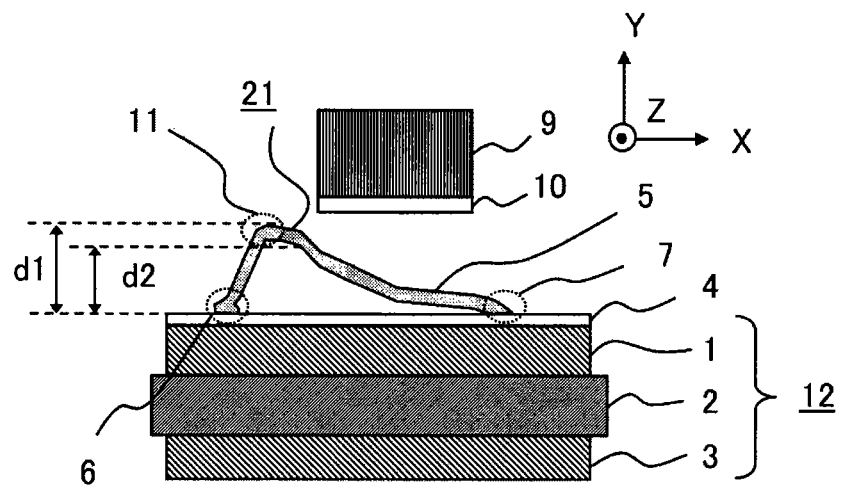
FIG. 5 is a diagram illustrating positions of a semiconductor element and a wire, according to Embodiment 1 of the invention.
Figure 6:
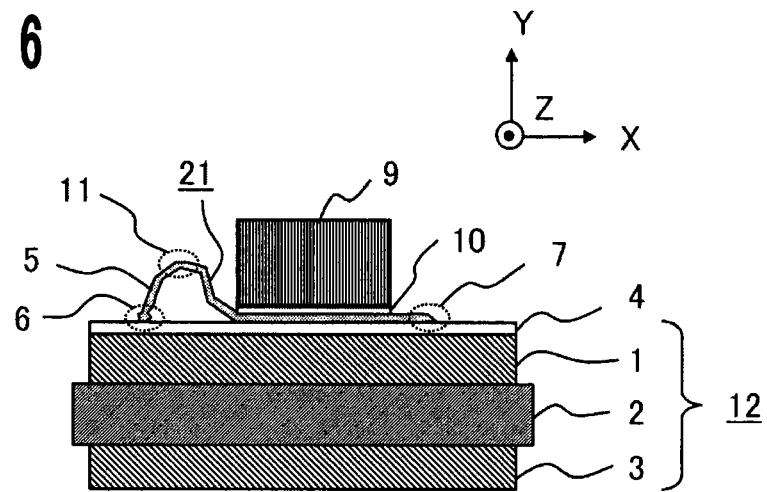
FIG. 6 is a diagram illustrating other positions of the semiconductor element and the wire, according to Embodiment 1 of the invention.

It has been experimentally confirmed that, in order for the wire not to overlap itself, the mounting position is to be kept out of the maximum loop height, and when it is on a portion with a height that is at least lowered to 80% of the maximum loop height, it is possible to suppress overlapping as shown in FIG. 5 and FIG. 6. FIG. 5 and FIG. 6 are diagrams each illustrating the positions of the semiconductor element and the wire according to Embodiment 1 of the invention. FIG. 5 shows a state before the semiconductor element 9 makes contact with the wire 5, and FIG. 6 shows a state where the semiconductor element 9 presses against the wire 5.

The above wire connecting step was repeated at the pitch b1=30 µm in the Y-direction and over an area until the length b2 that is longer than the element size c2. As the result, on the Ag layer 4 on the circuit board 12, the Ag wires were spread throughout the region (area by a1 and b2) that is broader than the element size (a chip bonding region 15) of the semiconductor element 9, to thereby form the wire structure 20 (wire structure forming step). A structure in which the wire structure 20 is formed on the Ag layer 4 on the circuit board 12 will be referred to as a wire-attached circuit board 21. The chip bonding region 15 is a region that is equal to the area of the mounting surface of the semiconductor element 9.

Then, on the wire-attached circuit board 21 with the throughout-spread Ag wires 5 and on the portions of the wires 5 at the height of 80% or less of the maximum loop height d1, the Sn layer 8 and the semiconductor element 9 on which the Ag layer 10 was formed were successively mounted (semiconductor element mounting step). This intermediate product was subjected to a heat treatment in a reductive atmosphere by formic acid at 180° C. for 10 minutes to thereby remove oxidation layers on the surfaces of the respective members. Then, it was subjected to vacuuming, followed by heat treatment at 300° C. for 10 minutes while a pressure at 1 MPa was being applied thereto using a simplified pressure jig (alloy layer forming step).

Description will be made about the applied pressure. In this case, a pressure at 1 MPa was applied. Since the size of the semiconductor element 9 is 7 mm×7 mm and thus the bonding area is 49 mm2, in order to apply 1 MPa, namely, a load of 49N thereto, it suffices to apply a load of 4.9 kgf≈5 kg. For this degree of load, a large-scale apparatus, such as a pressing machine, is not required, and it is easily achievable using a simplified jig in which a spring with stopper is attached. Note that designing/purchasing of the spring is available, for example, at/from Tokaibane Mfg. Co., Ltd, Japan. The pressure jig using that spring can be fabricated, for example, by Kishida Engineering Co. Ltd, japan.

Figure 9:
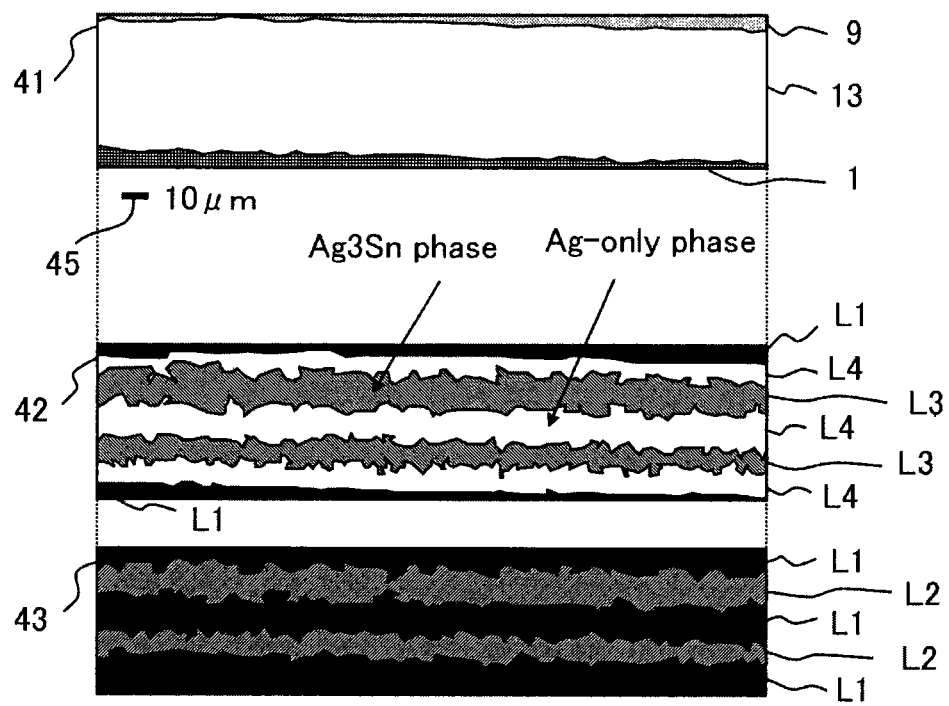
FIG. 9 is a diagram showing a sectional image and a composition analysis result of a typical bonding portion that is shown in an example of the invention.

Then, the intermediate product after completion of the bonding was cooled and then taken out, and the cross-section of the bonding portion was observed using a Scanning Electron Microscope (SEM). As a result, it was confirmed that the bonding portion was formed only of Ag and Ag3Sn, and there was no Sn-only phase therein. The sectional image and the composition analysis result of a typical bonding portion are shown in FIG. 9. Indicated in FIG. 9 are a sectional image 41 of the bonding portion, an Ag element distribution 42 and an Sn element distribution 43. The sectional image 41 of the bonding portion clearly shows boundaries between the semiconductor element 9, the alloy layer 13 and the upper electrode 1 in the sectional SEM image of the bonding portion including the alloy layer 13. A scale 45 indicates a length of 10 μm. Signs L1, L2, L3 and L4 indicate regions of four-stage detection levels for Ag element or Sn element, and L1 to L4 in this order correspond to the regions ordered from smaller to larger in detection amount. In the Ag element distribution 42, L4 region is an Ag-only phase and L3 region is an Ag3Sn phase in which Ag3Sn is formed. The Ag-only phase corresponds to L1 region in the Sn element distribution 43 where no Sn element is detected. The Ag3Sn phase corresponds to L2 region in the Sn element distribution 43. Note that in the Ag element distribution 42, a thin L3 region was present each in the upper and lower interspaces that are each placed between L1 region and L4 region; however, so as not to complicate the figure, it is omitted here. Meanwhile, when the bonding portion was observed using a transmission X-ray apparatus and a void rate was calculated through binarization of the transmission X-ray image, the void rate was excellent as 4% in comparison to a target void rate of 10% or less. The thus-fabricated sample is defined as Example 1.

Then, using the same processes as those described above, nine samples were fabricated in which the wire size (wire diameter) x of the Ag wire 5 was varied from 12 to 50 μm and the pitch y was varied, as shown in FIG. 10. The respective samples are defined as Examples 2 to 10. FIG. 10 is a table showing characteristics in the examples of the invention and in comparison examples. In Examples 2 to 10, with respect to each wire size, the pitch y is given as 2.5x that have been calculated from the formula (1), and the Ag layer 10 of the semiconductor element 9 and the Ag layer 4 of the wire-attached circuit board 21 are each given with the thickness z that is within the ranges calculated from the formulae (11) and (12). For each of Examples 2 to 10, an alloy-forming state was observed using the SEM, and the void rate was calculated from the transmission X-ray image. As the result, in Examples 2 to 10, as shown in FIG. 10, the alloy-forming state was excellent, and the void rate was 4% or less and thus excellent.

In FIG. 10, there are stated fabrication conditions of the respective samples, and each alloy-forming state and void rate as the observation results. Shown in "Wire Extension Direction" is whether a single direction or a multiple directions of two or more directions. Shown in "Required Plating Thickness" is a thickness z of each of the Ag layers 4, 10 that satisfies the formula (11) and the formula (12). Shown in "Actual Plating Thickness z" is a thickness of each of the Ag layers 4, 10 in each sample. Shown in "Compatibility to Theoretical Formula" is whether the formula (1), the formula (11) and the formula (12) as theoretical formulae are satisfied ("OK" indication) or not ("NG" indication). Shown in "Required Sn-foil Thickness" is a thickness t of the Sn layer 8 that satisfies the formula (14) and the formula (15). Shown in "Actual Sn-foil Thickness t" is a thickness of the Sn layer 8 in each sample. Shown in "Alloy Formation" is whether the alloy layer 13 in the bonding portion is excellent or not. An "OK" indication is given when the alloy formation is excellent, showing that the bonding portion is only formed of Ag and Ag3Sn and there is no Sn-only phase. An "NG" indication is given when the alloy formation is not excellent.

As shown in Examples 1 to 10 in FIG. 10, when the thickness of the Sn layer 8 was the required thickness or more and the conditions represented by the formula (1), the formula (11) and the formula (12) were satisfied, every alloy-forming state and void rate was excellent.

Next, description will be made about Comparison Examples 1 to 4 shown in FIG. 10. Using the same processes as those described above, four samples were fabricated in which the wire size x of the Ag wire 5 was varied from 12 to 50 μm and the pitch y was varied from 30 to 125 μm that had been calculated from the formula (1). In Comparison Examples 1 to 4, with respect to each wire size, the pitch y is given as 2.5x that have been calculated from the formula (1), and the Ag layer 10 of the semiconductor element 9 and the Ag layer 4 of the wire-attached circuit board 21 are each given with the thickness z that is out of the ranges calculated from the formulae (11) and (12). For each of Comparison Examples 1 to 4, an alloy-forming state was observed using the SEM, and the void rate was calculated from the transmission X-ray image. As the result, in Comparison Examples 1 to 4, as shown in FIG. 10, the void rate was excellent as less than the target of 10%; however, the alloy-forming state was not excellent (NG) because an Sn-only phase partly remained.

Next, description will be made about Examples 11 to 14 shown in FIG. 11. FIG. 11 is a table showing characteristics in these examples of the invention and in comparison examples. Using the same processes as those described above, four samples were fabricated in which the wire size x of the Ag wire 5 was varied from 12 to 50 µm and the pitch y was varied from 40 to 140 µm that satisfied the formula (2). In Examples 11 to 14, with respect to each wire size, the pitch y is given as a value that is larger than 2.5x and thus satisfies the formula (2), and the Ag layer 10 of the semiconductor element 9 and the Ag layer 4 of the wire-attached circuit board 21 are each given with the thickness z that is within the ranges calculated from the formulae (11) and (12). For each of Examples 11 to 14, an alloy-forming state was observed using the SEM, and the void rate was calculated from the transmission X-ray image. As the result, in Examples 11 to 14, as shown in FIG. 11, the alloy-forming state was excellent, and the void rate was 4% or less and thus excellent.

Next, description will be made about Comparison Examples 5 and 6 that correspond to Patent Documents 1 and 2. So far, evaluations have been made on a featured state of the invention in which the Ag wires 5 are spread in one direction. In turn, such a sample was fabricated in which the Ag wires 5 were spread in two directions (X-direction, Y-direction). First, using the same processes as those described above, as the same as in Example 7, the wire size x was given as 30 µm, the pitch y was given as 75 µm and the thickness z of the Ag layers 4, 10 is given as 16.5 µm, and then the wires 5 were spread in the X-direction. Thereafter, the circuit board 12 was rotated by 90 degrees, and the other wires 5 were further bonded thereon in the Y-direction while being appropriately adjusted not to cause inter-wire contact. Then, on the portions of the wires 5 at the height of 80% or less of the maximum loop height d1, the Sn layer 8 and the semiconductor element 9 on which the Ag layer 10 was formed were successively mounted (semiconductor element mounting step). This intermediate product was subjected to the same processes as those in Examples 1 to 14, to thereby fabricate each of Comparison Examples 5 and 6. The difference between Comparative Example 5 and Comparative Example 6 resides in the thickness of the Sn layer 8, and the thickness was 50 µm in the case of Comparison Example 5 and 40 µm in the case of Comparison Example 6.

For each of Comparison Examples 5 and 6, an alloy-forming state was observed using the SEM, and the void rate was calculated from the transmission X-ray image. As the result, in Comparison Example 5 in which the thickness of the Sn layer 8 was 50 µm, there was an Sn-only phase and thus the alloy-forming state was not excellent, and in addition, the void rate was 15% and could not clear the target condition of 10% or less. In Comparison Example 6 in which the thickness of the Sn layer 8 was 40 µm, the alloy-forming state is excellent; however, the void rate was degraded to be 20% because the amount of Sn was insufficient and the void did not go way completely.

According to the semiconductor device 30 of Embodiment 1, an Ag—Sn intermetallic compound of Ag3Sn (melting point is about 470° C.) that does not melt even at 300° C., is formed in the bonding portion between the circuit board 12 and the semiconductor element 9, etc., namely in a bonding portion where bonding is made between the bonding objects, so that the alloy layer 13 having a high melting point can be formed. In the semiconductor device 30 of Embodiment 1, the Ag layers 4, 10 are formed on the bonding objects, such as the circuit board 12, the semiconductor element 9 and the like, and on the Ag layer 4 of the circuit board 12 that is one of the bonding objects, a plurality of Ag wires 5 are spread on a plane only in one direction whereby the wire structure 20 is formed that is bonded so that its Ag wires 5 are prevented from flowing out at the time of the bonding. The semiconductor device 30 of Embodiment 1 is characterized by including the alloy layer 13 made of the intermetallic compound of Ag3Sn (melting point is about 470° C.) and Ag, which is obtained by melting Sn on the wire-attached circuit board 21 in which the wire structure 20 is formed on the Ag layer 4 on the circuit board 12. According to the semiconductor device 30 of Embodiment 1, it is possible to form a high-melting-point intermetallic compound of Ag3Sn in a void-reduced state, in the bonding portion between the circuit board 12 and the semiconductor element 9, etc., namely in the bonding portion where bonding is made between the bonding objects.

According to the semiconductor device 30 of Embodiment 1, the Ag wires 5 are spread in one direction, so that, with respect to voids that would have been produced to no small extent when Sn was melted to form the intermetallic compound Ag3Sn, the routes through which the voids go away have been established. Thus, it becomes possible to reduce the voids as compared with the case of a wire net in which Ag wires are spread in the X-direction and the Y-direction. Further, because of using the Ag wires 5, a sufficient amount of Ag is supplied from the wires 5 and the Ag layers to the bonding portion between the circuit board 12 and the semiconductor element 9, etc., so that it is possible to form the intermetallic compound of Ag3Sn with a sufficient thickness and thus, to make uniform a bonding thickness, namely, the thickness of the alloy layer 13. According to the semiconductor device 30 of Embodiment 1, since a portion with an excessively-thin bonding thickness does not emerge in the bonding portion between the circuit board 12 and the semiconductor element 9, etc., there is an effect of suppressing occurrence of a crack at the bonding portion.

It should be noted that the atmosphere at the time of bonding is not limited to that by formic acid, and may be by acetic acid, citric acid, toluene acid or hydrogen. In the currently-described experiments, the Ag-wire size (wire diameter x) was given as 12 to 50 µm. Its limit has been deemed to about 50 µm in the conventional wire bonder; but, if the bonder can be customized to be capable of bonding a wire larger than 50 µm, the Ag-wire size is not limited to 12 to 50 µm. However, when the wire size is made larger than 50 µm, the pitch y becomes larger necessarily and thus the volume to be covered by Ag3Sn increases, so that the Ag layers 4, 10 are required to be much thicker. This causes an increase in cost and is thus not preferable. Further, this increases the fabrication cost and makes the tact time longer because the temperature and the time for forming Ag3Sn have to be higher and longer, and is thus not preferable. In contrast, when the Ag-wire size is smaller than 12 µm, it is difficult to stably extending the wires, thus providing a possibility that the wire is broken at the time of extending the wires or wire bonding, and thus this is not preferable. Accordingly, the Ag-wire size is preferably from 12 to 50 µm.

The pressure to be applied at the time of bonding, just has to properly press down the floating wire 5, and similar effects can be achieved at 0.1 MPa or more. When the applied pressure is lower than 0.1 MPa, it is difficult to properly apply a load, so that the bonding thickness becomes unstable. Meanwhile, when an applying pressure at about 1 MPa has already been applied once after the Ag-wire bonding but before the bonding in the reductive atmosphere, the shape of each Ag wire becomes more stable at the time of the bonding, and thus this is preferable.

Figures 12, 13:
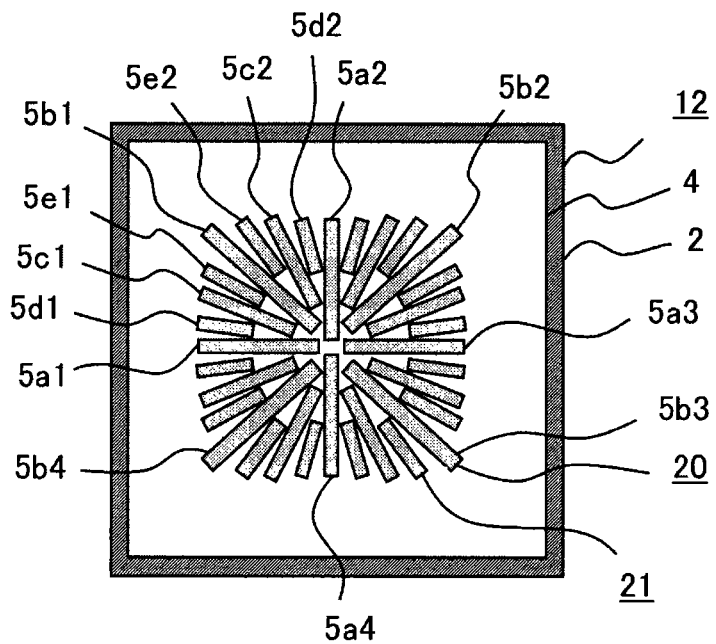
FIG. 12 is a table showing a thickness, at each temperature and each time, of the intermetallic compound of $Ag_3Sn$ of the invention.
FIG. 13 is a diagram showing an arrangement of wires according to Embodiment 2 of the invention.

The temperature and the time at the time of the bonding are arbitrary conditions applied until Ag and Sn complete their interdiffusion. The growing rates of. Ag3Sn were determined from experiments, the results of which are shown in FIG. 12. FIG. 12 is a table showing the thickness, at each temperature and each time, of the intermetallic compound of Ag3Sn of the invention. Samples were fabricated each by mounting a 300 μm thick Sn pellet on a 1 mm thick Ag plate of 10 mm×10 mm, and subjecting them to heat treatment under arbitrary conditions in temperature and time, in the reductive atmosphere by formic acid. Thereafter, cross-section observation was carried out using the SEM to inspect the thickness of Ag3Sn. The results are as shown in FIG. 12, and the samples heat-treated under the conditions of 250° C. and 1 minute had even a thickness of 3.8 μm in average.

For the purpose of reference, a 300 μm thick Sn pellet was mounted on a 1 mm thick Cu plate of 10 mm×10 mm, and they were subjected to heat treatment under arbitrary conditions in the reductive atmosphere by formic acid, and thereafter, cross-section observation was carried out using the SEM to inspect the thickness of an alloy layer of Cu and Sn. It has been confirmed therefrom that the thickness is about 0.7 μm and thus, the diffusion of Ag is 5 to 6 times faster.

As the foil-like Sn layer 8, an Sn-100% layer was used in the currently-described cases; however, this is not limitative. For example, in Sn, at least one of Ag, Cu, Sb, Bi, In, Zn, Mg, Si, P, Ga, Ni, Co and Ge, may be contained.

As a material of the wires 5, Ag is preferable; however, even other than Ag, a similar effect is also achieved by Ni, Cu, Fe or Au. When the material of the wires 5 is other than Ag, instead of the Ag layer 4 and the Ag layer 10, layers of a material corresponding to that of the wires 5 are used. Further, in Ag of the wires 5, at least one of Pd, Ni, Cu, Fe, Au, Pt, Al, Sn, Sb, Ti and P, may be added. Further, the bonding portion is not limited to a bonding portion between the semiconductor element 9 and the circuit board 12, and may be used as a bonding portion, for example, between the circuit board 12 and a heat dissipation plate disposed thereunder, or the semiconductor element 9 and a lead frame.

Although the semiconductor element 9 may be a usual element from a silicon wafer as a base member, in this invention, a so-called wide bandgap semiconductor material that is wider in bandgap than silicon, such as silicon carbide (SiC), a gallium nitride (GaN)-series material or diamond, can be applied. While the device type of the semiconductor element 9 is not required to be limited, a switching element such as an IGBT (Insulated Gate Bipolar Transistor) and a MOSFET (Metal Oxide Semiconductor Field-Effect-Transistor), or a rectifier element such as a diode, may be mounted. For example, when silicon carbide (SiC), a gallium nitride (GaN)-series material or diamond is used for the semiconductor element 9 serving as a switching element or a rectifier element, since its power loss is lower than a conventionally-used element formed of silicon (Si), it becomes possible to enhance efficiency of a power module. Further, since its withstand voltage property is high and its allowable current density is also high, it becomes possible to downsize the power module. Furthermore, the wide bandgap semiconductor element is high in heat resistance and thus allows high temperature operation, so that it allows downsizing of the heat dissipation fin and substitution of a water-cooled part with an air-cooled type. Thus, it becomes possible to further downsize the power module provided with the heat dissipation fin.

As described above, according to the semiconductor device 30 of Embodiment 1, it is characterized by comprising the alloy layer 13 sandwiched between the first Ag layer 4 formed on the mounting board (circuit board 12) and the second Ag layer 10 formed on the semiconductor element 9, wherein the alloy layer 13 contains an intermetallic compound of Ag3Sn formed by Ag components of the first Ag layer and the second Ag layer and Sn, and the plurality of wires 5 containing Ag are arranged as being extended from the outside-facing periphery of the alloy layer 13. Namely, it comprises a structure in which the plurality of wires 5 containing Ag are connected to the alloy layer 13 containing the intermetallic compound of Ag3Sn, so that, with respect to voids that would have been produced to no small extent at the time of forming the alloy layer 13, routes through which the voids go away have been established between the wires 5. Thus, it is possible to form a high-melting-point intermetallic compound in a void-reduced state, in the bonding portion where bonding is made between the bonding objects.

Further, according to the semiconductor device 30-fabrication method of Embodiment 1, it is characterized by comprising: a wire structure forming step of forming the wire structure 20 in which the plurality of wires 5 containing Ag are arranged in parallel or in radial directions, on the first Ag layer 4 formed on the mounting board (circuit board 12); a semiconductor element mounting step of mounting on the wire structure 20, through the Sn layer 8, the semiconductor element 9 whose mounting surface has an area smaller than the outline area of the wire structure 20 and in which the second Ag layer 10 is formed on the mounting surface; and an alloy layer forming step of performing heat treatment after the semiconductor element mounting step, so as to form the alloy layer 13 containing an intermetallic compound of Ag3Sn in the bonding portion where the mounting board (circuit board 12) and the semiconductor element 9 are bonded together. Thus, with respect to voids produced to no small extent at the alloy layer forming step, routes through which the voids go away can be established. Thus, it is possible to form a high-melting-point intermetallic compound in a void-reduced state, in the bonding portion where bonding is made between the bonding objects.

Embodiment 2

The arranged form of the Ag wires 5 is not limited to the arranged form shown in Embodiment 1 and may be, for example, such an arranged form in which the wires are arranged radially as shown in FIG. 13. FIG. 13 is a diagram showing the arrangement of the wires according to Embodiment 2 of the invention. The wire structure 20 shown in FIG. 13 is an example in which regions partitioned by four wires 5a1, 5a2, 5a3, 5a4 are the same in form. For the sake of convenience, shown between the wire 5a1 and the wire 5a2 is called "a first region", between the wire 5a2 and the wire 5a3 is called "a second region", between the wire 5a3 and the wire 5a4 is called "a third region" and between the wire 5a4 and the wire 5a1 is called "a fourth region".

The wire 5a1 and the wire 5a3 are disposed collinearly, and the wire 5a2 and the wire 5a4 are disposed collinearly. The wire 5a2 is disposed perpendicular to the wire 5a1 and the wire 5a3, and the wire 5a4 is also disposed perpendicular to the wire 5a1 and the wire 5a3. In the first region, a wire 5b1 is disposed so that its angles with respect to the wire 5a1 and the wire 5a2 are the same. Likewise, in the second region, a wire 5b2 is disposed so that its angles with respect to the wire 5a2 and the wire 5a3 are the same; in the third region, a wire 5b3 is disposed so that its angles with respect to the wire 5a3 and the wire 5a4 are the same; and in the fourth region, a wire 5b4 is disposed so that its angles with respect to the wire 5a4 and the wire 5a1 are the same.

Description will be made about the arrangement of the other wires, citing the first region as an example. A wire 5c1 is disposed so that its angles with respect to the wire 5a1 and the wire 5b1 are the same. Likewise, a wire 5c2 is disposed so that its angles with respect to the wire 5b1 and the wire 5a2 are the same. A wire 5d1 is disposed between the wire 5a1 and the wire 5c1, and a wire 5d2 is disposed between the wire 5c2 and the wire 5a2. A wire 5e1 is disposed between the wire 5c1 and the wire 5b1, and a wire 5e2 is disposed between the wire 5b1 and the wire 5c2. In the wire structure 20 shown in FIG. 13, an outer circumferential shape developed by thirty-two number of wires 5 is given as a rounded quadrangular shape.

Figure 14:
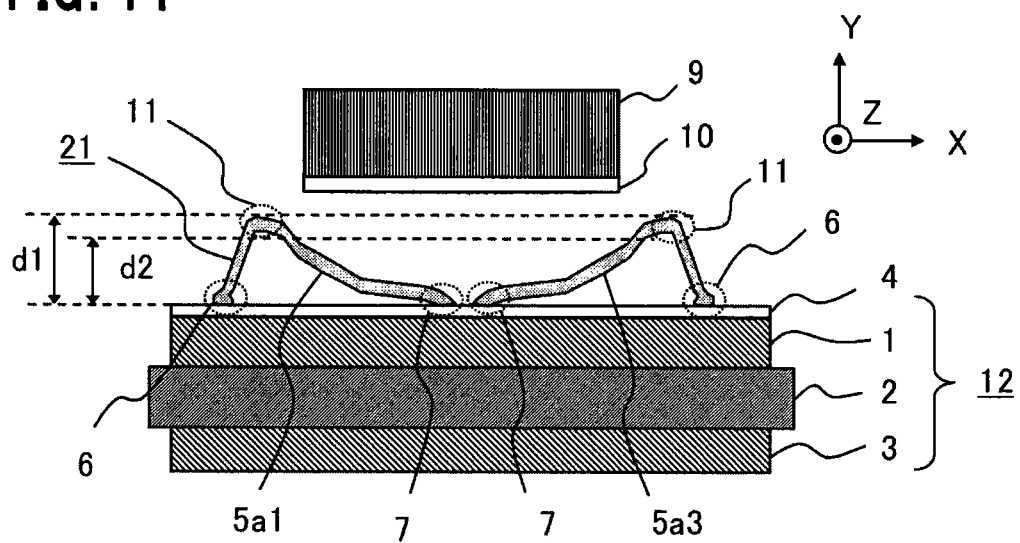
FIG. 14 is a diagram illustrating positions of a semiconductor element and wires, according to Embodiment 2 of the invention.
Figure 15:
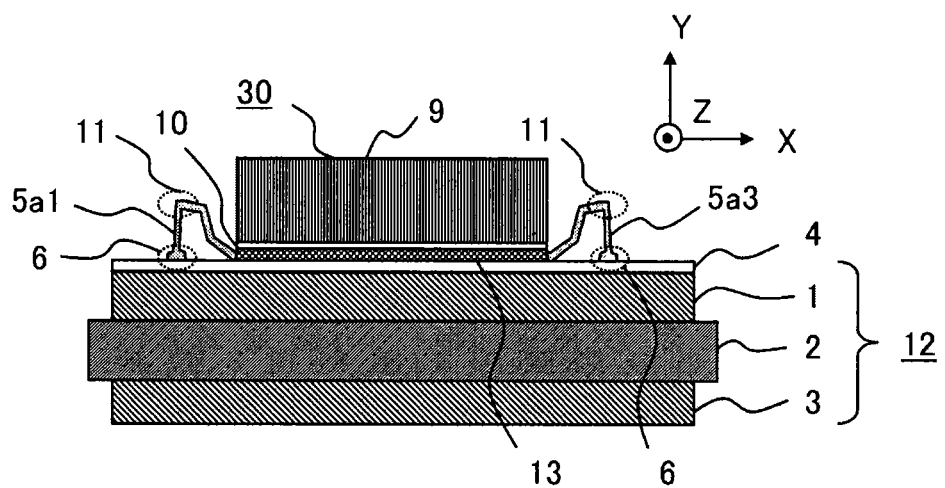
FIG. 15 is a sectional view of a semiconductor device according to Embodiment 2 of the invention.

FIG. 14 is a diagram illustrating the positions of the semiconductor element and the wires, according to Embodiment 2 of the invention, and FIG. 15 is a sectional view of the semiconductor device according to Embodiment 2 of the invention. Shown in FIG. 14 and FIG. 15 are cross-sections when cutting is done at the wire 5a1 and the wire 5a3. FIG. 14 shows a state before the semiconductor element 9 makes contact with the wires 5 of the wire-attached circuit board 21. Note that in FIG. 14 and FIG. 15, the other wires 5 other than the wire 5a1 and the wire 5a3 are omitted from illustration. For the semiconductor device 30 of Embodiment 2, at the wire connecting step in the wire structure forming step, there is a difference in that the wires 5 are wire-bonded from the outside toward the center side; however, the other steps are the same. In the semiconductor element mounting step, like Embodiment 1, the semiconductor element 9 is mounted on a place of the wire 5 where its loop height d2 is 80% or less of d1 at the element mounting position. In the semiconductor device 30, the plurality of wires 5 are arranged as being extended radially from the outside-facing periphery of the alloy layer 13.

According to the wire structure 20 of Embodiment 2, voids that are produced to no small extent at the time Sn is melted to form the intermetallic compound of Ag3Sn, will go away from the center side toward the outer peripheral side. Even if configured as shown in FIG. 13, with respect to the voids produced to no small extent at the time Sn is melted to form the intermetallic compound of Ag3Sn, routes through which the voids go away are established, so that a void-reduced excellent bonding is achieved similarly to Embodiment 1. Note that in FIG. 13 to FIG. 15, it has been exemplified that each stitch bond 7 is placed almost at the center of the wire structure 20; however, this is not limitative, and the stitch bond 7 just has to be placed inside the wire structure 20.

It should be noted that combination of the respective embodiments and an appropriate modification/omission in the embodiments may be made in the present invention without departing from the scope of the invention.

DESCRIPTION OF REFERENCE NUMERALS AND SIGNS

4: Ag layer, 5, 5a, 5b, 5c, 5d, 5e, 5f, 5g: wires, 5a1, 5a2, 5a3, 5a4, 5b1, 5b2, 5b3, 5b4, 5c1, 5c2, 5d1, 5d2, 5e1, 5e2: wires, 8: Sn layer, 9: semiconductor element, 10: Ag layer, 11: bent portion, 12: circuit board, 13: alloy layer, 20: wire structure, 30: semiconductor device.

The invention claimed is:

1. A semiconductor device in which a semiconductor element is bonded to a mounting board, said semiconductor device comprising:
   an alloy layer sandwiched between a first Ag layer formed on the mounting board and a second Ag layer formed on the semiconductor element;
   wherein the alloy layer contains an intermetallic compound of $Ag_3Sn$ formed by Ag components of the first Ag layer and the second Ag layer and Sn, and a plurality of wires containing Ag are arranged as being extended from an outside-facing periphery of the alloy layer.

2. The semiconductor device of claim 1, wherein the wires are arranged as being extended in the same direction.

3. The semiconductor device of claim 1, wherein the wires are arranged as being extended radially from the outside-facing periphery of the alloy layer.

4. The semiconductor device of claim 1, wherein, in the wires, as a material other than Ag, there is added at least one of Pd, Ni, Cu, Fe, Au, Pt, Al, Sn, Sb, Ti and P.

5. The semiconductor device of claim 1, wherein the semiconductor element is formed of a wide bandgap semiconductor material.

6. A semiconductor device fabrication method of fabricating a semiconductor device in which a semiconductor element is bonded to a mounting board, said semiconductor device fabrication method comprising:
   a wire structure forming step of forming a wire structure in which a plurality of wires containing Ag are arranged in parallel or radially, on a first Ag layer formed on the mounting board;
   a semiconductor element mounting step of mounting on the wire structure, through an Sn layer, the semiconductor element whose mounting surface has an area smaller than an outline area of the wire structure and in which a second Ag layer is formed on the mounting surface; and
   an alloy layer forming step of performing heat treatment after the semiconductor element mounting step, so as to form an alloy layer containing an intermetallic compound of Ag3Sn in a bonding portion where the mounting board and the semiconductor element are bonded together.

7. The semiconductor device fabrication method of claim 6, wherein, in the wire structure forming step, the wire structure is formed so as to have, at it outer peripheral side, a bent portion that provides a maximum height of the wire structure; and in the semiconductor element mounting step, the semiconductor element is mounted on a region of the wire structure at a height lower than 80% of the maximum height.

8. The semiconductor device fabrication method of claim 6, wherein the wire structure forming step includes a wire connecting step of connecting to the first Ag layer, the wires so as to be in parallel with each other.

9. The semiconductor device fabrication method of claim 6, wherein the wire structure forming step includes a wire connecting step of connecting to the first Ag layer, the wires while extending them from an outer side to an inner side of the wire structure.

10. The semiconductor device fabrication method of claim 8, wherein, when a thickness of each of the first Ag layer and the second Ag layer is given as z, a wire diameter of the wires is given as x, and a pitch at which the wires are arranged is given as y, the followings are satisfied:

$$y \geq 2.5x, z \geq 0.53x, z \geq 0.21y.$$

11. The semiconductor device fabrication method of claim 10, wherein, when a thickness of the Sn layer is given as t, the followings are satisfied:

$$t \geq 0.68x, t \geq 0.27y.$$

12. The semiconductor device fabrication method of claim 6, wherein, a wire diameter of the wires is 12 μm or more but 50 μm or less.

13. The semiconductor device fabrication method of claim 6, wherein, a thickness of each of the first Ag layer and the second Ag layer is 6.3 μm or more but 26.3 μm or less.

14. The semiconductor device fabrication method of claim 8, wherein, a pitch at which the wires are arranged is 30 μm or more but 125 μm or less.

15. The semiconductor device fabrication method of claim 11, wherein, the thickness of the Sn layer is 9 μm or more but 35 μm or less.

16. The semiconductor device fabrication method of claim 6, wherein, in the Sn layer, there is contained, other than Sn, at least one of Ag, Cu, Sb, Bi, In, Zn, Mg, Si, P, Ga, Ni, Co and Ge.

17. The semiconductor device fabrication method of claim 7, wherein the wire structure forming step includes a wire connecting step of connecting to the first Ag layer, the wires so as to be in parallel with each other.

18. The semiconductor device fabrication method of claim 7, wherein the wire structure forming step includes a wire connecting step of connecting to the first Ag layer, the wires while extending them from an outer side to an inner side of the wire structure.

* * * * *